United States Patent
Ho et al.

(10) Patent No.: US 7,257,782 B2
(45) Date of Patent: Aug. 14, 2007

(54) METHOD AND APPARATUS FOR REDUCING POWER CONSUMPTION IN AN INTEGRATED CIRCUIT CHIP

(75) Inventors: Pei-Hsin Ho, Portland, OR (US); Yongseok Cheon, Portland, OR (US); Qinke Wang, La Jolla, CA (US)

(73) Assignee: Synopsys, Inc., Mountain View, CA (US)

( * ) Notice: Subject to any disclaimer, the term of this patent is extended or adjusted under 35 U.S.C. 154(b) by 130 days.

(21) Appl. No.: 11/182,100

(22) Filed: Jul. 14, 2005

(65) Prior Publication Data

US 2006/0090153 A1    Apr. 27, 2006

Related U.S. Application Data

(60) Provisional application No. 60/621,591, filed on Oct. 22, 2004.

(51) Int. Cl.
*G06F 17/50* (2006.01)

(52) U.S. Cl. ............ 716/2; 716/6; 716/9; 716/12; 716/18

(58) Field of Classification Search .......... 716/2, 716/6, 9, 12, 18
See application file for complete search history.

(56) References Cited

U.S. PATENT DOCUMENTS 5,218,551 A * 6/1993 Agrawal et al. ............ 716/10
6,216,252 B1 * 4/2001 Dangelo et al. ............. 716/1

* cited by examiner

*Primary Examiner*—Thuan Do
(74) *Attorney, Agent, or Firm*—Park, Vaughan & Fleming LLP (57) ABSTRACT

A system that reduces power consumption in an integrated circuit. During operation the system receives a placement for the integrated circuit. The system then groups registers in the placement into clusters and builds a temporary clock tree for the registers within the placement. Next the system assigns net weights to clock wires in the temporary clock tree and signal wires between the rest of the cells of the circuit, and uses the assigned net weights to optimize placement of the cells of the circuit by minimizing a sum of the weighted costs of the wires, wherein the weighted cost of a wire is a product of the net weight of the wire and the length of the wire.

24 Claims, 7 Drawing Sheets

METHOD AND APPARATUS FOR REDUCING POWER CONSUMPTION IN AN INTEGRATED CIRCUIT CHIP

RELATED APPLICATION

This application hereby claims priority under 35 U.S.C. § 119 to U.S. Provisional Patent Application No. 60/621,591 filed 22 Oct. 2004, entitled "Low-Power Placement," by inventors Pei-Hsin Ho, Yongseok Cheon, and Qinke Wang.

BACKGROUND

1. Field of the Invention

The present invention relates to techniques for reducing power consumption in an integrated circuit (IC) chip. More specifically, the present invention relates to a method and apparatus for reducing power consumption of the IC chip by judiciously placing the standard cells in the IC chip.

2. Related Art

Advances in semiconductor technology presently make it possible to integrate large-scale systems, including tens of millions of transistors, onto a single semiconductor chip. Integrating such large-scale systems onto a single semiconductor chip increases the speed at which such systems can operate, because signals between system components do not have to cross chip boundaries, and are not subject to lengthy chip-to-chip propagation delays. Moreover, integrating large-scale systems onto a single semiconductor chip significantly reduces production costs, because fewer semiconductor chips are required to perform a given computational task.

However, as the clock frequency of these systems increases, power consumption also increases. In addition to meeting timing and area constraints, power consumption is becoming an important concern for designers of integrated circuits. Excessive power consumption can cause problems in dissipating heat. Additionally, to prolong battery life used in mobile devices such as laptops, cell phones, PDAs, and MP3 players, power consumption must be reduced.

Power consumption can be divided into several components: net-switching power, leakage power, and cell internal power. Net-switching power is the power consumed when switching a net from one state to another one. At the present time, net-switching power accounts for the majority of the power consumption in an integrated circuit chip.

A large component of net-switching power comes from clock nets because clock nets switch during every cycle. Furthermore, the clock tree has a large load because it drives all of the registers and the clock lines feeding the registers. The power consumed on these clock nets is proportional to $k*V^2*C*f$, where k is a constant, V is the supply voltage, C is the capacitance of the net and the load connected to the net, and f is the switching frequency of the signal. As the frequency increases or the capacitance increases, power consumption increases. This net-switching power can be somewhat mitigated by decreasing the supply voltage, but this technique has limitations because as supply voltage is decreased, the transistors will run out of headroom and noise margin. The invention reduces $C*f$, the product of the capacitance and the switching frequency.

A small amount of power consumption within a cell occurs when a temporary short-circuit path between VDD to ground exists. For instance, when an inverter circuit switches from high-to-low or low-to-high, for a brief time interval during the transition, the pull-up device and the pull-down device are both conducting, which causes the inverter circuit to consume a large amount of power. This power consumption component can be somewhat mitigated by sizing the transistors to trade-off performance for decreased power consumption.

In addition to the power management techniques mentioned above, It is possible to turn off the clock in the unused sections of the chip, which can significantly reduce power consumption. It is also possible to reduce or cut off the voltage supply to the sections of the chip not being used. However, when these sections of the chip are active, net-switching power is still being consumed.

Even if all of the above-described techniques are used, power consumption still remains a problem. Hence, what is needed is a method and an apparatus to reduce power consumption in an integrated circuit chip even further.

SUMMARY

One embodiment of the present invention provides a system that reduces power consumption in an integrated circuit. During operation the system receives a placement for the integrated circuit. The system then groups registers in the placement into clusters and builds a temporary clock tree for the registers within the placement. Next the system assigns net weights to clock wires in the temporary clock tree and uses the assigned net weights to optimize placement of registers by minimizing a sum of the weighted costs of the clock wires, wherein the weighted cost of a clock wire is a product of the net weight of the clock wire and the length of the clock wire. This embodiment is herein referred to as "register clumping."

In a variation on this embodiment, the placement that the system starts out with can be any combination of a total weighted wire length driven placement, a congestion-driven placement, and a timing-driven placement.

In a variation on this embodiment, the net weight is the sum of a timing-weight component and a power-weight component. Furthermore, a tunable parameter is used to scale the timing-weight component relative to the power-weight component, thereby facilitating a trade-off between optimizing timing and optimizing power.

In a variation on this embodiment, the net weight of the clock wire contains a power-weight component, which is proportional to the switching frequency of a clock signal in the clock wire.

In a variation on this embodiment, the system measures the timing of the placement to determine timing criticality of signal wires. The system then assigns a net weight to signal wires based on the timing criticality and the switching frequency of the signal wires. The system then uses the net weight of the clock wires and the net weight of the signal wires to optimize placement of not only the registers but also the rest of the cells by minimizing total weighted wire length. This embodiment is herein referred to as "signal-net weighting." Note that the net weight for the signal wire contains a power-weight component and a timing-weight component. The power-weight component is proportional to a signal switching activity of the signal wire. The timing-weight component for the signal wire is proportional to the timing criticality of the signal wire.

In a variation on this embodiment, after placement of the registers is optimized, the system removes the temporary clock tree and performs a clock-tree-synthesis operation to generate a new clock tree with minimal clock skew.

In a variation on this embodiment, after placement of the registers is optimized, the system performs a clock-tree optimization on the temporary clock tree to reduce clock skew.

In a variation on this embodiment, the system assigns the net weight to clock wires in the temporary clock tree by assigning a net weight to the clock wires in leaf clusters of the temporary clock tree. These leaf clusters contain a final clock buffer and the registers the final clock buffer feeds.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Register Clumping

Up to 80% of the clock wire capacitance is contained within leaf clusters of a clock tree. A leaf cluster in the clock tree contains all of the registers which are connected to a "leaf" clock buffer, which is the farthest clock buffer from the root of the clock tree. Making the leaf clusters smaller decreases the capacitance of the leaf clusters, which decreases the capacitance of the whole clock tree, thereby reducing net-switching power consumed by the clock tree.

Figure 1A:
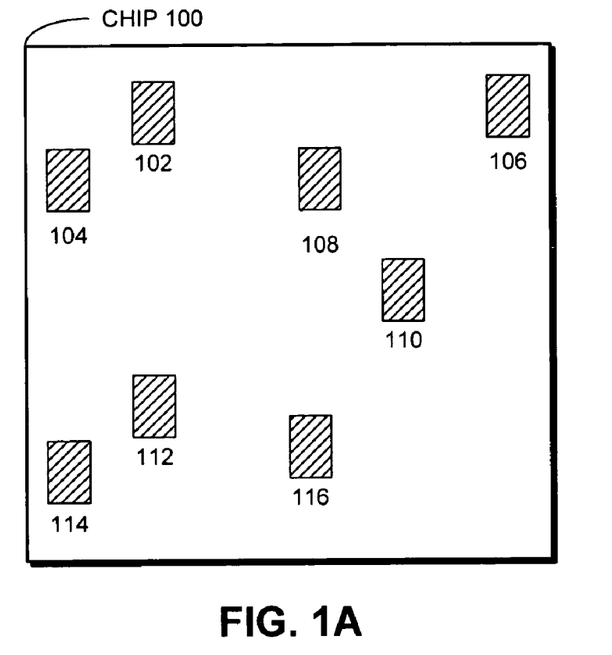
FIG. 1A illustrates a placement of registers.

FIG. 1A illustrates an exemplary placement of registers. It contains chip 100 and registers 102, 104, 106, 108, 110, 112, 114, and 116. In one embodiment of the present invention, the registers are clustered into groups.

Note that a clock-tree-synthesis tool will also cluster registers into groups in order to reduce clock tree capacitance, but the clock tree synthesis tool operates on previously placed registers. However, unlike the present invention, the clock tree synthesis tool does not move previously placed registers.

Figure 3:
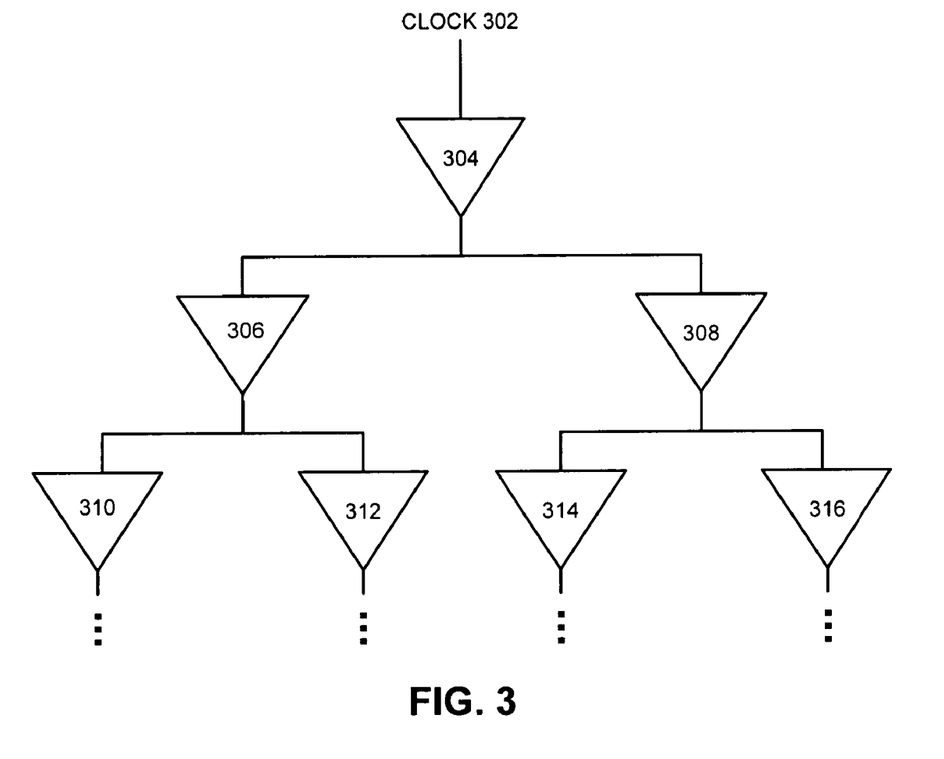
FIG. 3 presents a block diagram of a clock tree.

FIG. 3 presents an exemplary block diagram of a clock tree. It contains clock signal 302 and clock buffers 304, 306, 308, 310, 312, 314, and 316.

The clock-tree-synthesis tool attempts to make a clock tree with as little skew as possible. For instance, if clock buffer 316 has a heavier load than clock buffer 310, the clock-tree-synthesis tool will make the clock tree branch containing clock buffer 310 slower in order to equalize the clock arrival times at the leaf clusters connected to clock buffers 310 and 316. Methods to increase the delay of the clock signal include making longer clock wires and inserting buffers into the path to be delayed. Note that a single clock buffer drives registers in the same cluster. For instance, if clock buffer 310 is the leaf clock buffer in a branch of the clock tree, it drives registers in its leaf cluster.

Figure 1B:
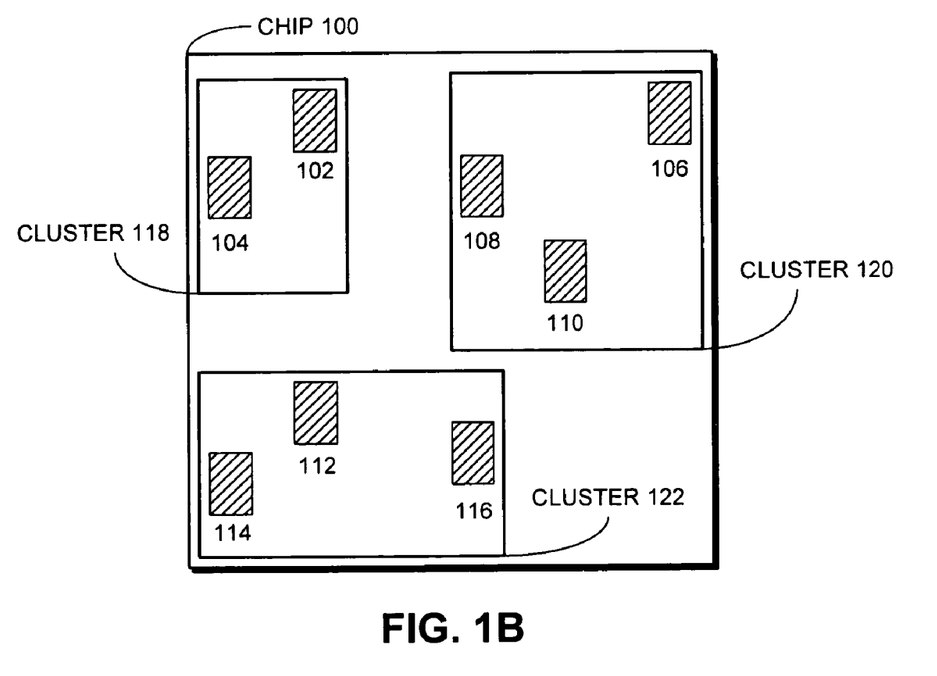
FIG. 1B illustrates a placement of registers after computing clusters.

FIG. 1B illustrates an exemplary placement of registers after computing clusters. It contains the same chip 100 and registers 102, 104, 106, 108, 110, 112, 114, and 116 which are grouped into clusters 118, 120, and 122. More specifically, registers 102 and 104 are grouped into cluster 118; registers 106, 108, and 110 are grouped into cluster 120; and registers 112, 114, and 116 are grouped into cluster 122. Next, the registers in each clusters are clumped together to reduce the capacitance of the leaf clusters and of the clock tree as a whole. Register clumping moves the registers closer together in order to reduce the clock wire capacitance in the leaf clusters of the clock tree. Group bounds are used to ensure that registers in the same cluster are placed closer to each other.

Figure 2A:
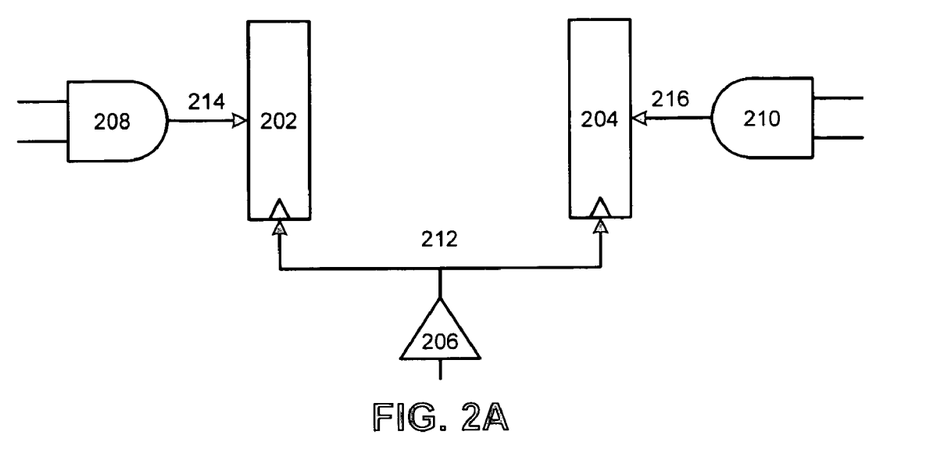
FIG. 2A presents a block diagram of two registers before register clumping in accordance with an embodiment of the present invention.

FIG. 2A presents a block diagram of two registers before register clumping in accordance with an embodiment of the present invention. It contains register 202, register 204, clock buffer 206, gate 208, gate 210, clock wire 212, signal wire 214, and signal wire 216. Note that clock wire 212 is long because registers 202 and 204 are far apart.

Figure 2B:
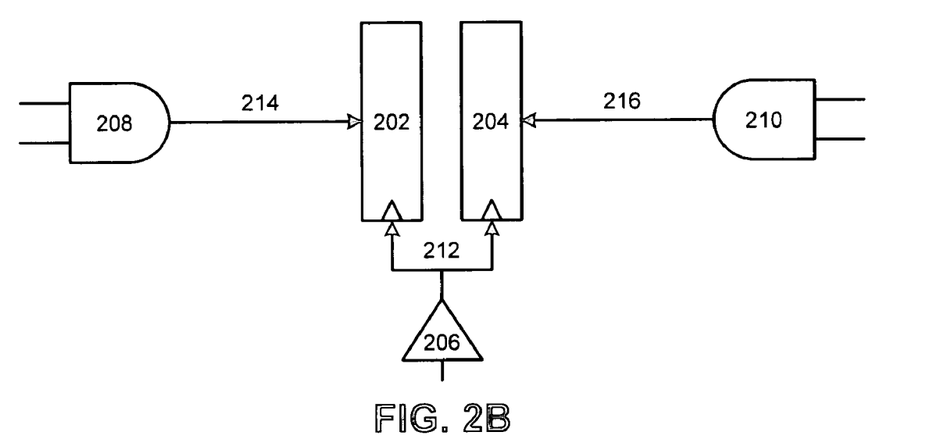
FIG. 2B presents a block diagram of two registers after register clumping in accordance with an embodiment of the present invention.

FIG. 2B presents a block diagram of two registers after register clumping in accordance with an embodiment of the present invention. It contains the same components as FIG. 2B except that after clumping registers 202 and 204, clock wire 212 is significantly shorter. However, signal wires 214 and 216 have become longer. Assuming that the clock wire 212 switches more often (i.e. higher switching frequency) than the signal wires 214 and 216, although the signal wires 214 and 216 become longer at the expense of making the clock wire 212 shorter, the total switching power consumption of the wires 212, 214 and 216 is reduced. Recall that the switching power consumption of a wire is proportional to the product of the switching frequency and the capacitance of the wire which is proportional to the length of the wire.

Net Weighting and Placement

One embodiment of the present invention reduces net-switching power by optimizing power during placement. In order to accomplish this goal without affecting convergence of the placement technique, net weighting can be used. Net weighting involves assigning a net weight for a wire. The cost of the net is equal to the net length multiplied by the net weight. The place-and-route tool attempts to make the higher cost nets shorter so that the sum of the costs of all of the nets is minimized. Note that a larger net weighting results in a shorter net. Net weighting is used in both register clumping (net weighting applied to the clock nets in the clock trees) and signal-net weighting (net weighting applied to the rest of the signal nets).

Figure 2C:
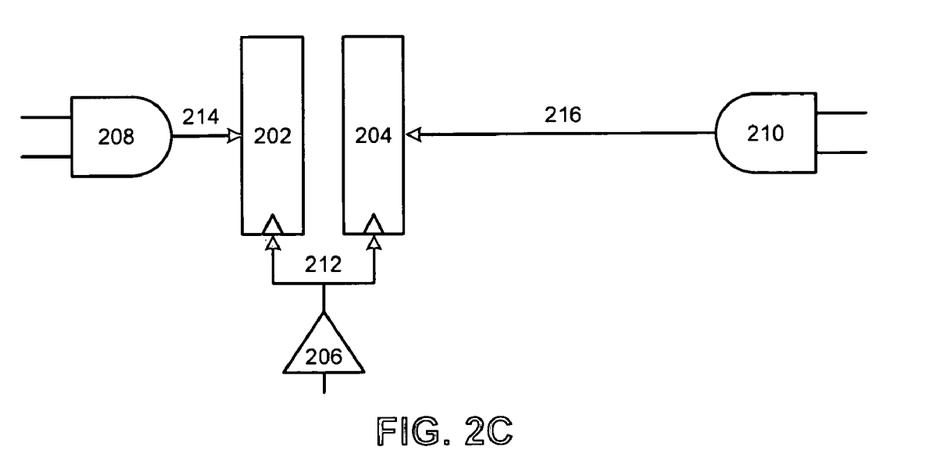
FIG. 2C presents a block diagram of two registers after register clumping and signal-net weighting in accordance with an embodiment of the present invention.

FIG. 2C presents a block diagram of two registers after both register clumping and signal-net weighting in accordance with an embodiment of the present invention. It contains the same components as FIG. 2B. If signal wire 214 is a signal net with higher switching frequency, the present invention assigns a higher net weight to it. After register clumping and signal-net weighting, signal wire 214 has been shortened while maintaining the shorter clock wire 212 obtained after register clumping. Although signal net 216 becomes longer, since the switching frequency of the signal net 216 is lower, the total switching power consumption of wires 212, 214 and 216 is further reduced than in FIG. 2B.

Figure 4A:
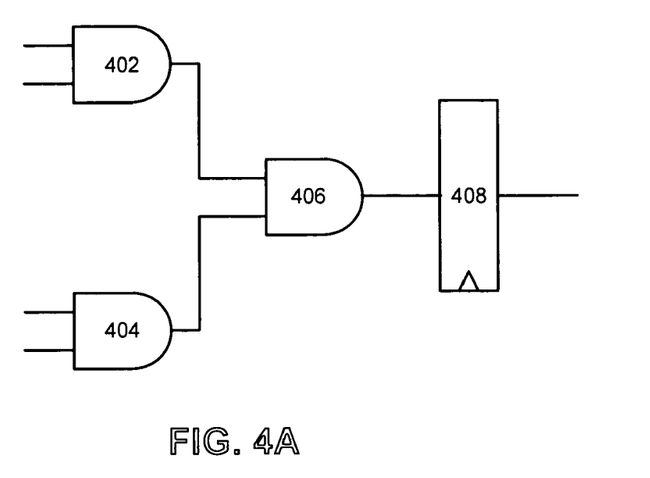
FIG. 4A presents a block diagram of a netlist.
Figure 4B:
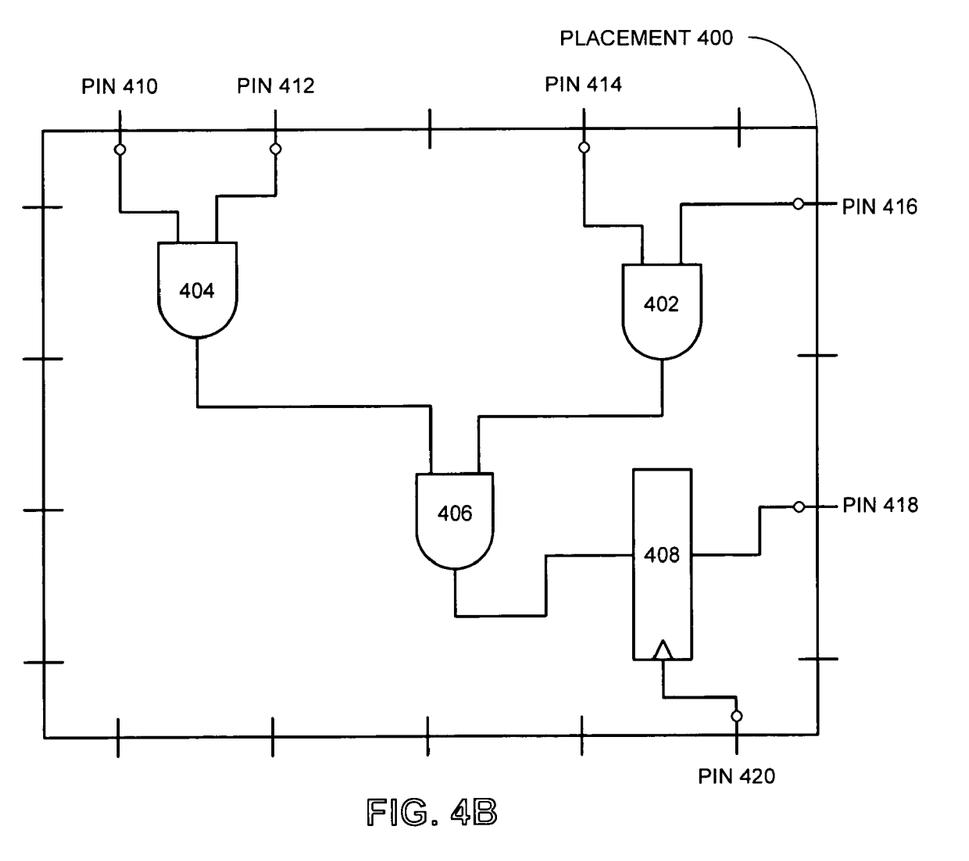
FIG. 4B presents a block diagram of a netlist after placement.

FIG. 4A presents a block diagram of a netlist. It contains gates 402, 404, and 406, and register 408. FIG. 4B presents a block diagram of the same netlist after placement. It contains the netlist in FIG. 4A as well as placement 400, and pins 410, 412, 414, 416, 418, and 420. The place-and-route tool places the netlist within placement 400. The inputs to gate 404 are connected to pins 410 and 412. The inputs to gate 402 are connected to pins 414 and 416. The data output of register 408 is connected to pin 418. The clock input of register 408 is connected to pin 420. This placement is not optimized because no information about the timing criticality and net-switching power of the nets was used to place the netlist. The net weighting technique considers information about these metrics to modify the placement.

Figure 5:
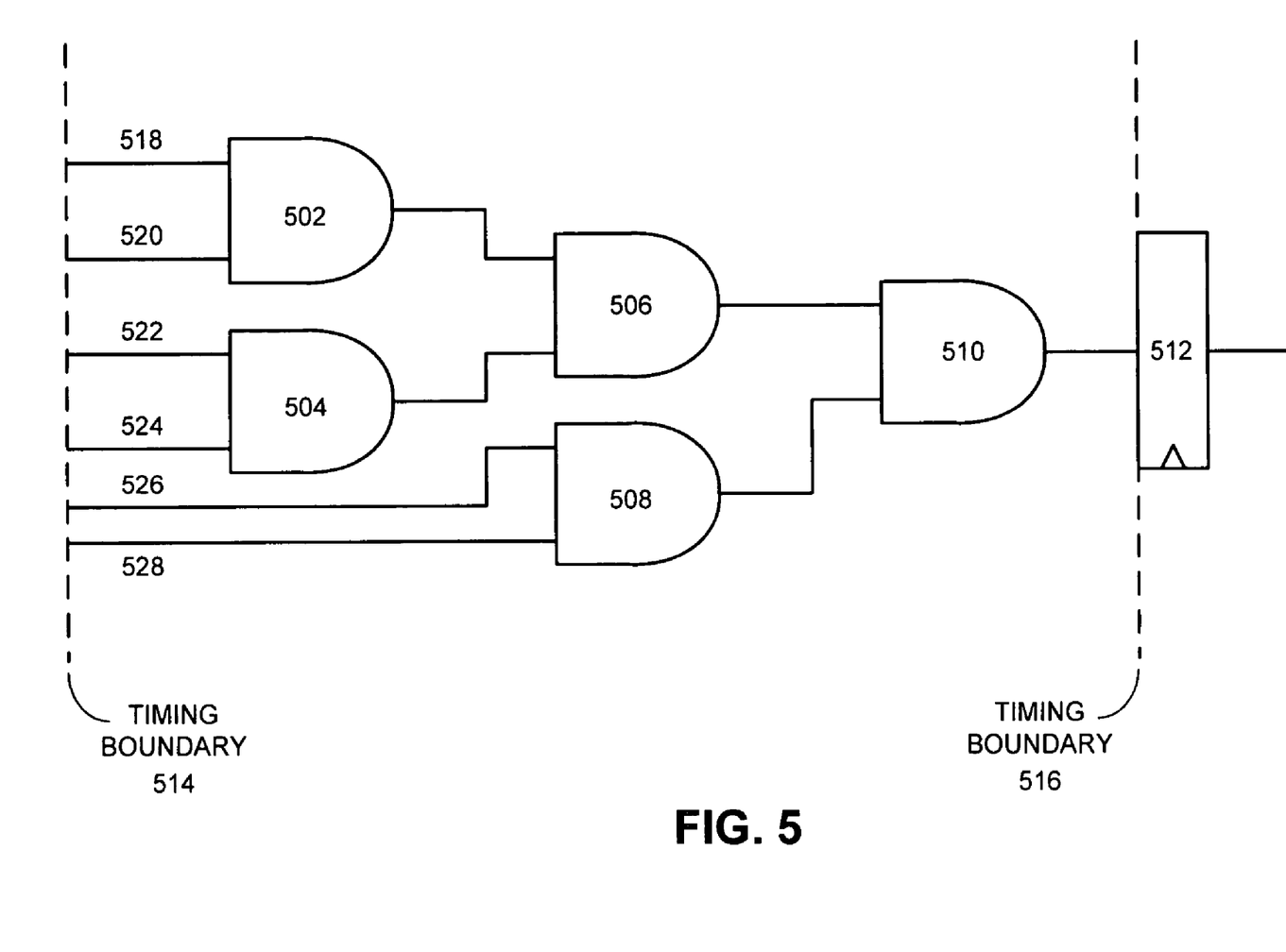
FIG. 5 presents a block diagram illustrating net weighting in accordance with an embodiment of the present invention.

FIG. 5 presents a block diagram illustrating net weighting in accordance with an embodiment of the present invention. It contains gates 502, 504, 506, 508, and 510, register 512, timing boundary 514, timing boundary 516, and signal lines 518, 520, 522, 524, 526, and 528. Note that signals must traverse the time interval between timing boundary 514 and timing boundary 516 in one clock cycle. Furthermore, note that signal wires 522 and 524 are more timing-critical than signal wires 526 and 528 because they feed through three levels of logic instead of two levels of logic before reaching register 512. Therefore, to properly account for the timing criticality of signal wires 522 and 524, these signal wires are given a higher net weight than signal wires 524 and 528. For instance, signal wires 522 and 524 can be assigned a net weight of 2 while signal wires 526 and 528 can be assigned a net weight of 1. The place-and-route tool determines the length of each signal wire by minimizing the sum of weighted costs of signal wires 518, 520, 522, 524, 526, and 528. The result of using these net weightings is that signal wires 526 and 528 can be longer than signal wires 522 and 524. The above-described process is referred to as "timing-driven placement."

Note that signal wires 518 and 520 are also timing-critical signals and are assigned a higher net weight than signal wires 526 and 528. Furthermore, if signal wires 518 and 520 switch more often than signal wires 522 and 524, they can be assigned a higher net weight than signal wires 522 and 524. For instance, a net weight of 4 can be assigned to signal wires 518 and 520.

One embodiment of the present invention applies a net weight for power consumption as well as for timing criticality. Note that the default weight for a net is 1 if no net weight is assigned. A tunable parameter can be used to make a tradeoff between optimizing the placement for power and timing. The net weight can be given by the following formula: net weight=$\alpha$*timing_weight+(1−$\alpha$)*power_weight.

Note that the signal net weight is proportional to the timing criticality of the net and the power net weight is proportional to the switching frequency of the net. Also note that nets on the critical path are given higher net weights.

Net-Weighted Placement

Figure 6:
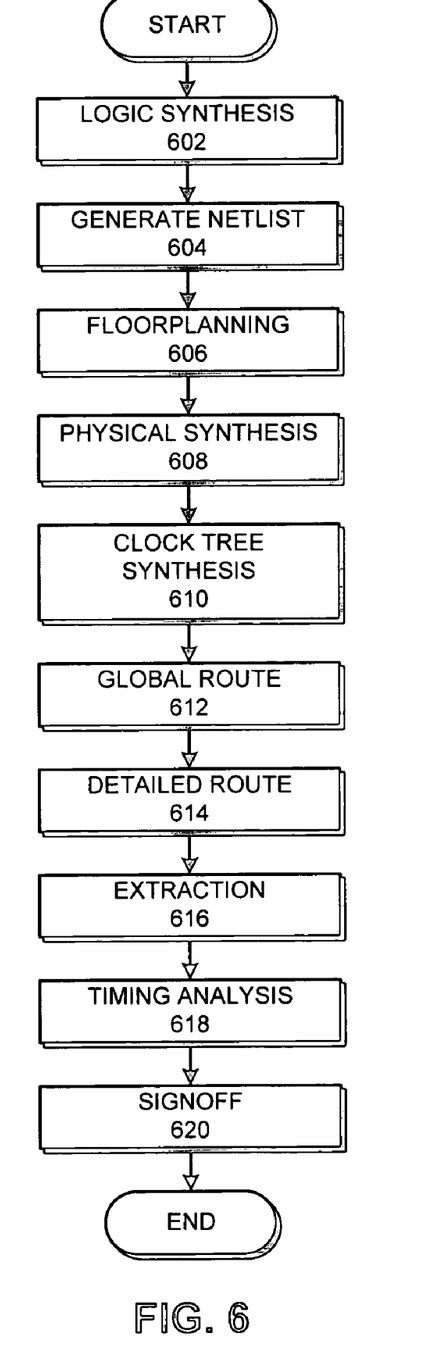
FIG. 6 presents a flow chart illustrating a standard integrated circuit design flow.

FIG. 6 presents a flow chart illustrating a standard integrated circuit design flow. It begins with logic synthesis (step 602) which outputs a netlist (step 604). The netlist is fed into a floorplanner (step 606) which is used to define the area and the aspect ratio of the design. Physical synthesis is then performed (step 608). Next, clock tree synthesis is performed (step 610), followed by a global route (step 612) and a detailed route (step 614). Extraction is then performed (step 616) and the extracted netlist is used to perform a timing analysis (step 618). If the chip meets timing, it is signed off (step 620).

Figure 7:
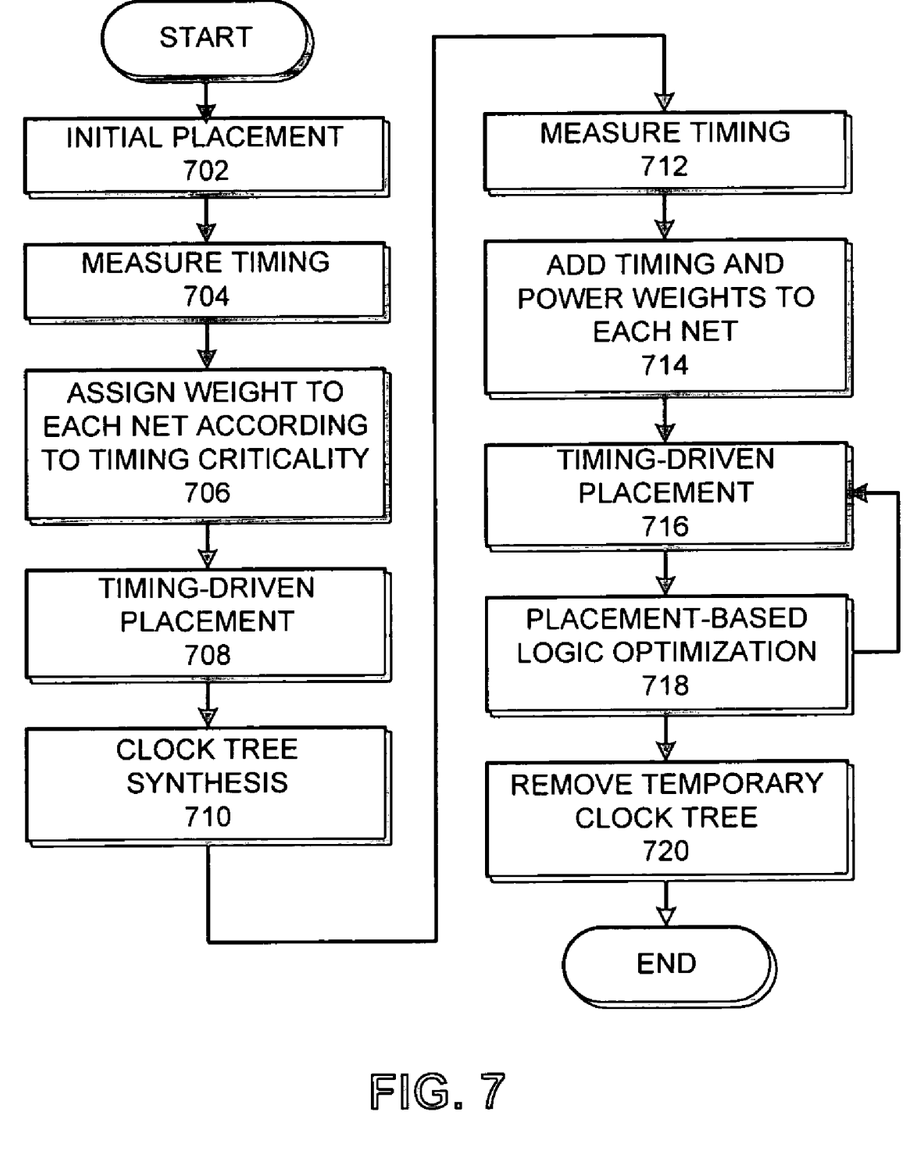
FIG. 7 presents a flow chart illustrating a placement technique for an integrated circuit design utilizing register clumping and signal-net weighting in accordance with an embodiment of the present invention.

FIG. 7 presents a flow chart illustrating a placement algorithm for an integrated circuit design utilizing net weighting in accordance with an embodiment of the present invention. It expands on the physical synthesis step (step 608) in FIG. 6. The process in FIG. 7 begins when the system receives an initial placement (step 702). Next, the system measures the timing (step 704) and assigns a weight to each net according to timing criticality (step 706).

The system then performs timing-driven placement (step 708), which involves minimizing a sum of the costs of the nets. The system then performs clock-tree-synthesis to generate a temporary clock tree (step 710). Next, the system measures timing again (step 712) and adds timing and power weights to each net (step 714). The system then performs timing-driven placement using the timing and power net weights (step 716) and placement-based logic optimization (step 718). The system iterates between timing-driven placement and placement-based logic optimization (steps 716 and 718) until the design goals are met. To minimize clock skew in the clock tree, the system removes the temporary clock tree (step 720).

Note that instead of removing the temporary clock tree and rerunning clock tree synthesis, the place-and-route tool can optimize the existing clock tree to minimize clock skew. Also note that the final clock tree generated will be similar to the temporary clock tree generated in step 710 because the registers are already placed. There will be slight differences between the two clock trees because the temporary clock tree is optimized for the net weighting while the final clock tree is optimized for minimal clock skew.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for reducing power consumption in an integrated circuit, comprising:
   receiving a placement for the integrated circuit;
   grouping registers in the placement into clusters;
   building a temporary clock tree for the registers within the placement;
   assigning net weights to clock wires in the temporary clock tree; and
   using the assigned net weights of the clock wires to optimize placement of registers by minimizing a sum of the weighted costs of the clock wires;
   wherein the weighted cost of a clock wire is a product of the net weight of the clock wire and the length of the clock wire; and wherein the net weight is a sum of a timing-weight component and a power-weight component associated with a net switching power.

2. The method of claim 1, wherein the placement can be a combination of:
a total weighted wire length driven placement; timing-driven placement;
and a congestion-driven placement.

3. The method of claim 1,
wherein a tunable parameter is used to scale the timing-weight component relative to the power-weight component, thereby facilitating a trade-off between optimizing timing and optimizing power.

4. The method of claim 3,
wherein the net weight of the clock wire contains a power-weight component; and
wherein the power-weight component of the clock wire is proportional to the switching frequency of a clock signal in the clock wire.

5. The method of claim 3, further comprising:
measuring the timing of the placement to determine timing criticality of signal wires;
assigning a net weight to signal wires based on the timing criticality and the switching frequencies of the signal wires; and
using the net weight of the clock wires and the net weight of the signal wires to optimize placement of not only the registers but also the rest of the cells by minimizing total weighted wire length;
wherein the net weight for the signal wire contains a power-weight component and a timing-weight component;
wherein the power-weight component for the signal wire is proportional to a signal switching frequency of the signal wire; and
wherein the timing-weight component for the signal wire is proportional to the timing criticality of the signal wire.

6. The method of claim 1, wherein after placement of the registers is optimized, the method further comprises:
removing the temporary clock tree; and
performing clock tree synthesis to generate a new clock tree with minimal clock skew.

7. The method of claim 1, wherein after placement of the registers is optimized, the method further comprises performing clock tree optimization on the temporary clock tree to reduce clock skew.

8. The method of claim 1,
wherein assigning the net weight to clock wires in the temporary clock tree involves assigning a net weight to the clock wires in leaf clusters of the temporary clock tree; and
wherein the leaf clusters contain a final clock buffer and the registers the final clock buffer feeds.

9. An apparatus for reducing power consumption in an integrated circuit, comprising:
a placer;
wherein the placer is configured to:
receive a placement for the integrated circuit;
group registers in the placement into clusters;
build a temporary clock tree for the registers within the placement;
assign net weights to clock wires in the temporary clock tree; and
use the assigned net weights of the clock wires to optimize placement of registers by minimizing a sum of the weighted costs of the clock wires;
wherein the weighted cost of a clock wire is a product of the net weight of the clock wire and the length of the clock wire; and
wherein the net weight is a sum of a timing-weight component and a power-weight component associated with a net switching power.

10. The apparatus of claim 9, wherein the placement can be a combination of:
a total weighted wire length driven placement;
a timing-driven placement; and a congestion-driven placement.

11. The apparatus of claim 9,
wherein a tunable parameter is used to scale the timing-weight component relative to the power-weight component, thereby facilitating a trade-off between optimizing timing and optimizing power.

12. The apparatus of claim 11,
wherein the net weight of the clock wire contains a power-weight component; and
wherein the power-weight component of the clock wire is proportional to the switching frequency of a clock signal in the clock wire.

13. The apparatus of claim 11, wherein the placer is configured to:
measure the timing of the placement to determine timing criticality of signal wires;
assign a net weight to signal wires based on the timing criticality and switching frequency of the signal wires; and
use the net weight of the clock wires and the net weight of the signal wires to optimize placement of not only the registers but also the rest of the cells by minimizing total weighted wire length;
wherein the net weight for the signal wire contains a power-weight component and a timing-weight component;
wherein the power-weight component for the signal wire is proportional to a signal switching activity of the signal wire; and
wherein the timing-weight component for the signal wire is proportional to the timing criticality of the signal wire.

14. The apparatus of claim 9, wherein after placement of the registers is optimized, the placer is configured to:
remove the temporary clock tree; and
perform clock tree synthesis to generate a new clock tree with minimal clock skew.

15. The apparatus of claim 9, wherein after placement of the registers is optimized, the placer is configured to performing clock tree optimization on the temporary clock tree to reduce clock skew.

16. The apparatus of claim 9,
wherein assigning the net weight to clock wires in the temporary clock tree involves assigning a net weight to the clock wires in leaf clusters of the temporary clock tree; and
wherein the leaf clusters contain a final clock buffer and the registers the final clock buffer feeds.

17. A computer system for reducing power consumption in an integrated circuit, comprising:
a placer;
wherein the placer is configured to:
receive a placement for the integrated circuit;
group registers in the placement into clusters;
build a temporary clock tree for the registers within the placement;

assign net weights to clock wires in the temporary clock tree; and use the assigned net weights of the clock wires to optimize placement of registers by minimizing a sum of the weighted costs of the clock wires;

wherein the weighted cost of a clock wire is a product of the net weight of the clock wire and the length of the clock wire; and wherein the net weight is a sum of a timing-weight component and a power-weight component associated with a net switching power.

18. The computer system of claim 17, wherein the placement can be a combination of:

a total weighted wire length driven placement; timing-driven placement; and congestion-driven placement.

19. The computer system of claim 17, wherein a tunable parameter is used to scale the timing-weight component relative to the power-weight component, thereby facilitating a trade-off between optimizing timing and optimizing power.

20. The computer system of claim 19, wherein the net weight of the clock wire contains a power-weight component; and wherein the power-weight component of the clock wire is proportional to the switching frequency of a clock signal in the clock wire.

21. The computer system of claim 19, wherein the placer is configured to:

measure the timing of the placement to determine timing criticality of signal wires;

assign a net weight to signal wires based on the timing criticality and the switching frequency of the signal wires; and use the net weight of the clock wires and the net weight of the signal wires to optimize placement of not only the registers but also the rest of the cells by minimizing total weighted wire length;

wherein the net weight for the signal wire contains a power-weight component and a timing-weight component;

wherein the power-weight component for the signal wire is proportional to a signal switching activity of the signal wire; and wherein the timing-weight component for the signal wire is proportional to the timing criticality of the signal wire.

22. The computer system of claim 17, wherein after placement of the registers is optimized, the placer is configured to:

remove the temporary clock tree; and perform clock tree synthesis to generate a new clock tree with minimal clock skew.

23. The computer system of claim 17, wherein after placement of the registers is optimized, the placer is configured to performing clock tree optimization on the temporary clock tree to reduce clock skew.

24. The computer system of claim 17, wherein assigning the net weight to clock wires in the temporary clock tree involves assigning a net weight to the clock wires in leaf clusters of the temporary clock tree; and wherein the leaf clusters contain a final clock buffer and the registers the final clock buffer feeds.

* * * * *